US009542515B2

(12) United States Patent
Liu et al.

(10) Patent No.: US 9,542,515 B2
(45) Date of Patent: Jan. 10, 2017

(54) METHODS, SYSTEMS, AND COMPUTER-READABLE MEDIA FOR MODEL ORDER REDUCTION IN ELECTROMAGNETIC SIMULATION AND MODELING

(75) Inventors: Jian Liu, Los Gatos, CA (US); Xiao Lin, San Jose, CA (US); Anyu Kuo, San Jose, CA (US); Jiayuan Fang, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 777 days.

(21) Appl. No.: 13/305,178

(22) Filed: Nov. 28, 2011

(65) Prior Publication Data

US 2013/0138417 A1 May 30, 2013

(51) Int. Cl.
*G06F 17/50* (2006.01)
(52) U.S. Cl.
CPC ................................. *G06F 17/5036* (2013.01)
(58) Field of Classification Search
None
See application file for complete search history.

(56) References Cited

U.S. PATENT DOCUMENTS

| 5,504,423 | A * | 4/1996 | Fang ........................ 324/762.02 |
| 7,149,666 | B2 * | 12/2006 | Tsang et al. .................... 703/13 |
| 8,165,861 | B2 * | 4/2012 | Guedon ........................... 703/13 |
| 2013/0006584 | A1 * | 1/2013 | Liu et al. .......................... 703/1 |

OTHER PUBLICATIONS

Li et al., "Model Order Reduction of Linear Networks with Massive Ports via Frequency-Dependent Port Packing", 2006 43rd ACM/IEEE Design Automation Conference, Jul. 2006, pp. 267-272.*
Rimolo-Donadio et al., "Simulation of via Interconnects Using Physics-Based Models and Microwave Network Parameters", 12th IEEE Workshop on Signal Propagation on Interconnects, May 2008, 4 pages.*
Zhang et al., "Systematic Microwave Network Analysis for Multilayer Printed Circuit Boards with Vias and Decoupling Capacitors", IEEE Transactions on Electromagnetic Compatibility, vol. 52, Issue 2, May 2010, pp. 401-409.*
IEEE, "IEEE 100 The Authoritative Dictionary of IEEE Standards Terms", Seventh Edition, 2000, p. 844.*

* cited by examiner

*Primary Examiner* — Omar Fernandez Rivas
*Assistant Examiner* — Herng-Der Day
(74) *Attorney, Agent, or Firm* — Andrews Kurth Kenyon LLP

(57) ABSTRACT

Methods, systems, and computer readable media are disclosed for simulating a circuit. The method may comprise a step of providing a network model of the circuit having a plurality of ports, the plurality of ports being associated with one or more net pairs. The method may also comprise combining the plurality of ports into one or more groups based on the net pairs, each group corresponding to a net pair. In addition, the method may comprise calculating, for each group, one or more expansion elements, wherein the one or more expansion elements are associated with a shared property among all ports of the group. Moreover, the method may comprise simulating the circuit using a combination of the expansion elements calculated for each group.

20 Claims, 5 Drawing Sheets

METHODS, SYSTEMS, AND COMPUTER-READABLE MEDIA FOR MODEL ORDER REDUCTION IN ELECTROMAGNETIC SIMULATION AND MODELING

TECHNICAL FIELD

The present invention relates to methods, systems, and computer-readable media for simulating and/or modeling electrical components, interconnects, and circuits. More particularly, the present invention relates to methods, systems, and computer-readable media for model order reduction in simulating and/or analyzing electrical circuits having multiple-layer printed-circuit boards and package structures.

BACKGROUND

In electronic circuit design, simulations are often performed before physical prototypes are constructed. During simulations involving electronic package and/or multi-layer printed circuit board (PCB), physical systems are usually represented or approximated by mathematical models, and the mathematical models often contain high-order linear- and/or non-linear systems, which are complicated and difficult (or time-consuming) to solve. Accordingly, there is a need to effectively reduce the order of mathematical models to improve speed and efficiency.

SUMMARY

In one embodiment, there may be provided a method for simulating a circuit. The method comprises: providing a network model of the circuit having a plurality of ports, the plurality of ports being associated with one or more net pairs; combining the plurality of ports into one or more groups based on the net pairs, each group corresponding to a net pair; for each group, calculating, one or more expansion elements, wherein the one or more expansion elements are associated with a shared property among all ports of the group; and simulating the circuit using a combination of the expansion elements calculated for each group.

In another embodiment, there may be provided a system for simulating a circuit. The system comprises: a processor and a memory communicatively coupled to the processor, wherein the processor is configured to: load a network model of the circuit having a plurality of ports, the plurality of ports being associated with one or more net pairs; combine the plurality of ports into one or more groups based on the net pairs, each group corresponding to a net pair; for each group, calculate one or more expansion elements, wherein the one or more expansion elements are associated with a shared property among all ports of the group; and simulate the circuit using a combination of the expansion elements calculated for each group.

In yet another embodiment, there may be provided a computer readable medium encoded with software code instructions, when executed by a computer, implementing a method for simulating a circuit. The method comprises: providing a network model of the circuit having a plurality of ports, the plurality of ports being associated with one or more net pairs; combining the plurality of ports into one or more groups based on the net pairs, each group corresponding to a net pair; for each group, calculating, one or more expansion elements, wherein the one or more expansion elements are associated with a shared property among all ports of the group; and simulating the circuit using a combination of the expansion elements calculated for each group.

The preceding summary is not intended to restrict in any way the scope of the claimed invention. In addition, it is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments and exemplary aspects of the present invention and, together with the description, explain principles of the invention. In the drawings.

DESCRIPTION OF EXEMPLARY EMBODIMENTS

Reference will now be made in detail to exemplary embodiments of the invention, examples of which are illustrated in the accompanying drawings. When appropriate, the same reference numbers are used throughout the drawings to refer to the same or like parts.

Embodiments of the present disclosure may involve system, method, and computer-readable medium for simulating and/or analyzing an electrical circuit. The term "electrical circuit" (or "circuit") may refer to any path which electrons from a voltage or current source follow. During design, fabrication, and/or testing of electrical circuits, computer simulation may be performed to analyze, evaluate, and/or verify electrical properties and/or behaviors of the circuits.

Figure 1:
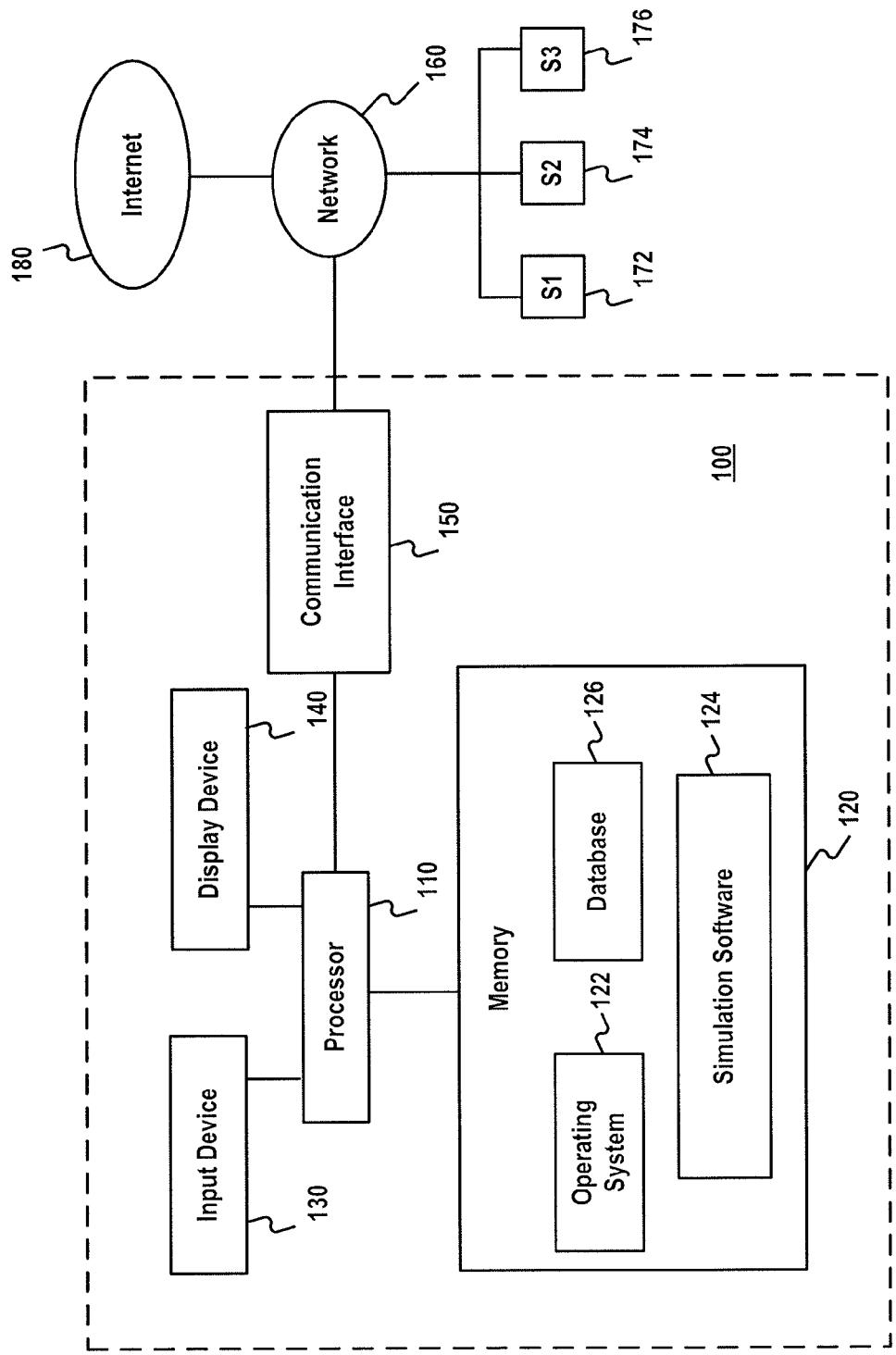
FIG. 1 shows an exemplary system for simulating and/or analyzing an electrical circuit, consistent with some disclosed embodiments.

FIG. 1 shows an exemplary system 100 for simulating an electrical circuit. Consistent with some embodiments, system 100 may be a general purpose computer, or a computing device dedicated for simulation. As shown in FIG. 1, system 100 may include a processor 110, a memory module 120, a user input device 130, a display device 140, and a communication interface 150. Processor 110 can be a central processing unit ("CPU") or a graphic processing unit ("GPU"). Depending on the type of hardware being used, processor 110 can include one or more printed circuit boards, and/or a microprocessor chip. Processor 110 can execute sequences of computer program instructions to perform various methods that will be explained in greater detail below.

Memory module 120 can include, among other things, a random access memory ("RAM") and a read-only memory ("ROM"). The computer program instructions can be accessed and read from the ROM, or any other suitable memory location, and loaded into the RAM for execution by processor 110. For example, memory module 120 may store one or more software applications. Software applications stored in memory module 120 may comprise operating system 122 for common computer systems as well as for software-controlled devices. Further, memory module may store an entire software application or only a part of a software application that is executable by processor 110.

In some embodiments, memory module 120 may store simulation software 124 that may be executed by processor 110. For example, simulation software 124 may be executed to simulate electrical behaviors/properties of electrical circuits. It is also contemplated that simulation software 124 or portions of it may be stored on a removable computer readable medium, such as a hard drive, computer disk, CD-ROM, DVD±R, CD±RW or DVD±RW, HD or Blu-ray DVD, USB flash drive, SD card, memory stick, or any other suitable medium, and may run on any suitable component of system 100. For example, portions of applications to perform simulation may reside on a removable computer readable medium and be read and acted upon by processor 110 using routines that have been copied to memory 120.

In some embodiments, memory module 120 may also store master data, user data, application data and/or program code. For example, memory module 120 may store a database 126 having therein various simulation data used for simulating electrical circuits.

In some embodiments, input device 130 and display device 140 may be coupled to processor 110 through appropriate interfacing circuitry. In some embodiments, input device 130 may be a hardware keyboard, a keypad, or a touch screen, through which a user may input information to system 100. Display device 140 may include one or more display screens that display the simulation interface, result, or any related information to the user.

Communication interface 150 may provide communication connections such that system 100 may exchange data with external devices. For example, system 100 may be connected to network 160. Network 160 may be a LAN or WAN that may include other systems S1 (172), S2 (174), and S3 (176). Systems S1, S2, and/or S3 may be identical to system 100, or may be different systems. In some embodiments, one or more of systems in network 160 may form a distributed computing/simulation environment that collaboratively performs simulation task. In addition, network 160 may be connected to Internet 180 to communicate with servers or clients that reside remotely on the Internet.

Embodiments of the present disclosure may also involve system, method, and computer-readable medium for simulating an electronic packaging structure. The term "electronic packaging structure" may refer to physical implementations of electrical circuits of integrated circuit (IC) chips, modules, chip or module carriers, cards, boards, and/or back-planes. Electronic packaging structures may include multiple layers to sandwich electronic components and/or signal/power lines. As used herein, the term "electronic packaging structure" is interchangeable with "multi-layer package structure."

Figure 2A:
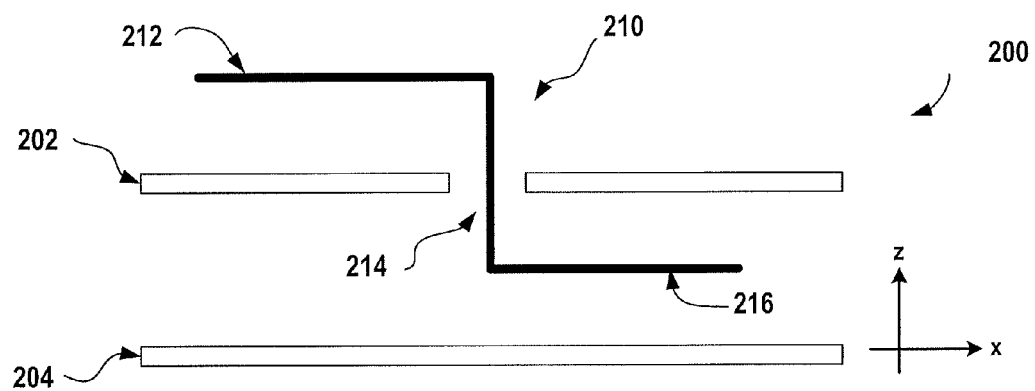
FIG. 2A is a schematic diagram of an electronic packaging structure, consistent with some disclosed embodiments.

FIG. 2A illustrates an exemplary electronic packaging structure 200. In FIG. 2A, the z direction represents a direction substantially perpendicular to the multiple layers, e.g., a direction measuring the "thickness" or "height" of the structure, while the x direction represents a direction substantially parallel to the multiple layers. As shown in FIG. 2A, electronic packaging structure 200 may include at least a portion of an electronic component, an IC chip, a PCB board, and/or an electronic system. Electronic packing structure 200 may include two conductive planes 202 and 204, which may be made of metal, such as copper, aluminum, silver, gold, or other suitable conductive materials. Conductive planes 202 and 204, which may also be referred as conductive plates, may be substantially parallel to each other, with non-conductive dielectric material in between (not shown). Each of the conductive planes 202 and 204 may be a ground plane or a power plane, depending on specific configuration of the electronic packaging structure.

Electronic packaging structure 200 may include an interconnect transitional component 210, as illustrated in FIG. 2A. Interconnect transitional component 210 may be made of conductive materials, such as metal, on which electronic signal may be carried. Interconnect transitional component 210 may also be referred as "signal path" or "signal trace." Interconnect transitional component 210 may be used to carry dynamic and/or transitional information and route the information and/or interconnect electrical components within one layer or among multiple layers of the electronic packaging structure 200.

In FIG. 2A, interconnect transitional component 210 may include a microstrip line 212, a via 214, and a strip line 216. Microstrip line 212 may include a portion of the interconnect transitional component 210 that is disposed on an outer surface of a conductive plane, such as conductive plane 202, but electrically insulated from the conductive plane by non-conductive material (not shown). In some embodiments, microstrip line 212 may be disposed at least partially on a top or bottom surface of the electronic packaging structure 200. Microstrip line 212 may be used to connect the electronic packaging structure 200 with external signal sources/destinations and/or other electronic units. Via 214 may be a portion of the interconnect transitional component 210 that passes through one or more conductive planes, such as plane 202 of FIG. 2A, but electronically insulated from the conductive plane(s) being passed through by non-conductive material. For example, via 214 may pass conductive plane 202 through a hole thereon, thereby insulating itself from plane 202 by the dielectric material between planes 202 and 204, and air. Via 214 may also be referred as "via pin" or "pin." Via 214 may be used to connect components in different layers, route signal through conductive plane(s), and/or connect plane(s)/component(s) to power source or ground. Strip line 216 may be a portion of the interconnect transitional component 210 that is at least partially interposed between two conductive planes, such as planes 202 and 204. Strip line 216, or together with via 214, may be used to provide electrical interconnections between electrical circuits/components both internal and external to the electronic packaging structure 200. As shown in FIG. 2A, strip line 216 may be embedded in non-conductive dielectric material sandwiched between conductive planes. In some embodiments, interconnect transitional component 210 may include only a via, a strip line, or a microstrip line. In other embodiments, interconnect transitional component 210 may include at least one of a via, a strip line, and a microstrip line, or any combination thereof.

Figure 2B:
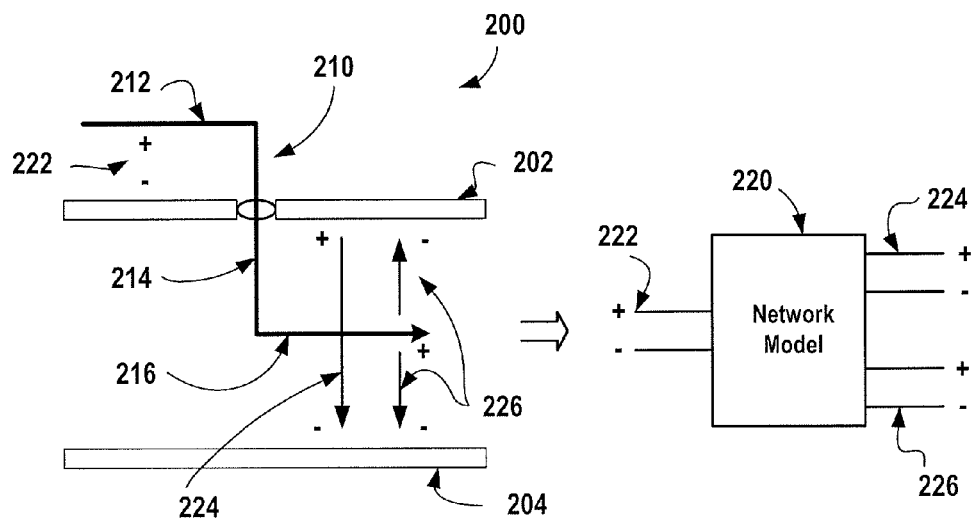
FIG. 2B is a schematic diagram of a network model having a plurality of ports defined based on the electronic package structure of FIG. 2A, consistent with some disclosed embodiments.

Some aspects of the disclosure may involve a network model with one or more ports. FIG. 2B illustrates an exemplary network model 220. The term "network," also known as "electrical network," refers to an interconnection of electrical elements such as resistors, inductors, capacitors, transmission lines, voltage sources, current sources, switches, semiconductor devices, etc. The term "network model" refers to a mathematical representation of a physical network. A network model may include graphical representations of the network and associated ports. A network model may also include a set of mathematical expressions and/or values that characterize the properties and/or behaviors of the network. As used herein, a network model may also be referred to as a "network" for simplicity.

A network may include one or more ports. A port may be a point at which electrical currents either enter or exit a network. In a circuit structure, a port may be defined by two terminals, where each terminal may be connected or electrically attached to a conductive material, such as metal surface. FIG. 2B illustrates three ports: 222, 224, and 226, each having two terminals: one positive (+) and the other negative (−). It is noted that the positive/negative signs are for analysis purpose and may not represent the actual voltage potential difference. For example, actual voltage potential on a positive (+) terminal may or may not be higher than the voltage potential on a negative (−) terminal. The terminals of ports 222, 224, and 226 may be connected together internally by an electrical network, whose properties may be characterized by a network function associated with network model 220. Exemplary network function may include: impedance parameters (z-parameters), admittance parameters (y-parameters), hybrid parameters (h-parameters), inverse hybrid parameters (g-parameters), transmission parameters (ABCD-parameters), scattering parameters (S-parameters), and scattering transfer parameters (T-parameters).

A port may be defined based on electrical and/or mechanical properties of an electronic structure. For example, in FIG. 2B, a three-port network may be defined to model the electronic packaging structure 200 in FIG. 2A. A microstrip line port 222 may be defined for interconnect transitional component 210 based on microstrip line 212. A parallel-plate port 224 may be defined for interconnect transitional component 210 based on via 214. A strip line port 226 may be defined for interconnect transitional component 210 based on strip line 216. It is noted that although the above ports are said to be defined "for interconnect transitional component 210," one skilled in the art would understand that these ports are defined to account for electrical properties/behavior determined by both the interconnect transitional component 210 and conductive planes 202, 204. Therefore, as used herein, electrical properties of interconnect transitional component refer to properties determined by both the interconnect transitional component and one or more conductive planes that electrometrically interact with the interconnect transitional component.

Figure 3:
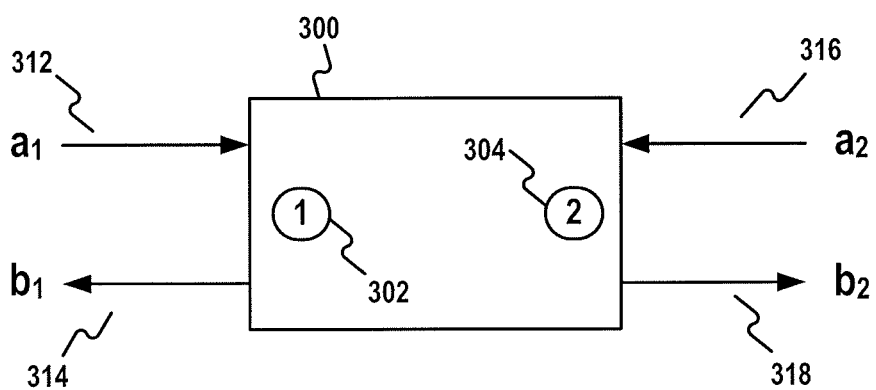
FIG. 3 is another schematic diagram of a network model, consistent with some disclosed embodiments.

FIG. 3 illustrates another exemplary network model. In FIG. 3, a network 300 may include two ports: port 1 (302) and port 2 (304). In general, a network model may include any number of ports. For each port, incident waves and reflected waves may be defined. For example, for port 1 (302), $a_1$ (312) represents incident waves and $b_1$ (314) represents reflected waves. Similarly, for port 2 (304), $a_2$ (316) represents incident waves and $b_2$ (318) represents reflected waves. Network model 300 may be characterized by an associated network function that is related to the above incident/reflected waves ($a_1$, $b_1$, $a_2$, and $b_2$).

Figure 4:
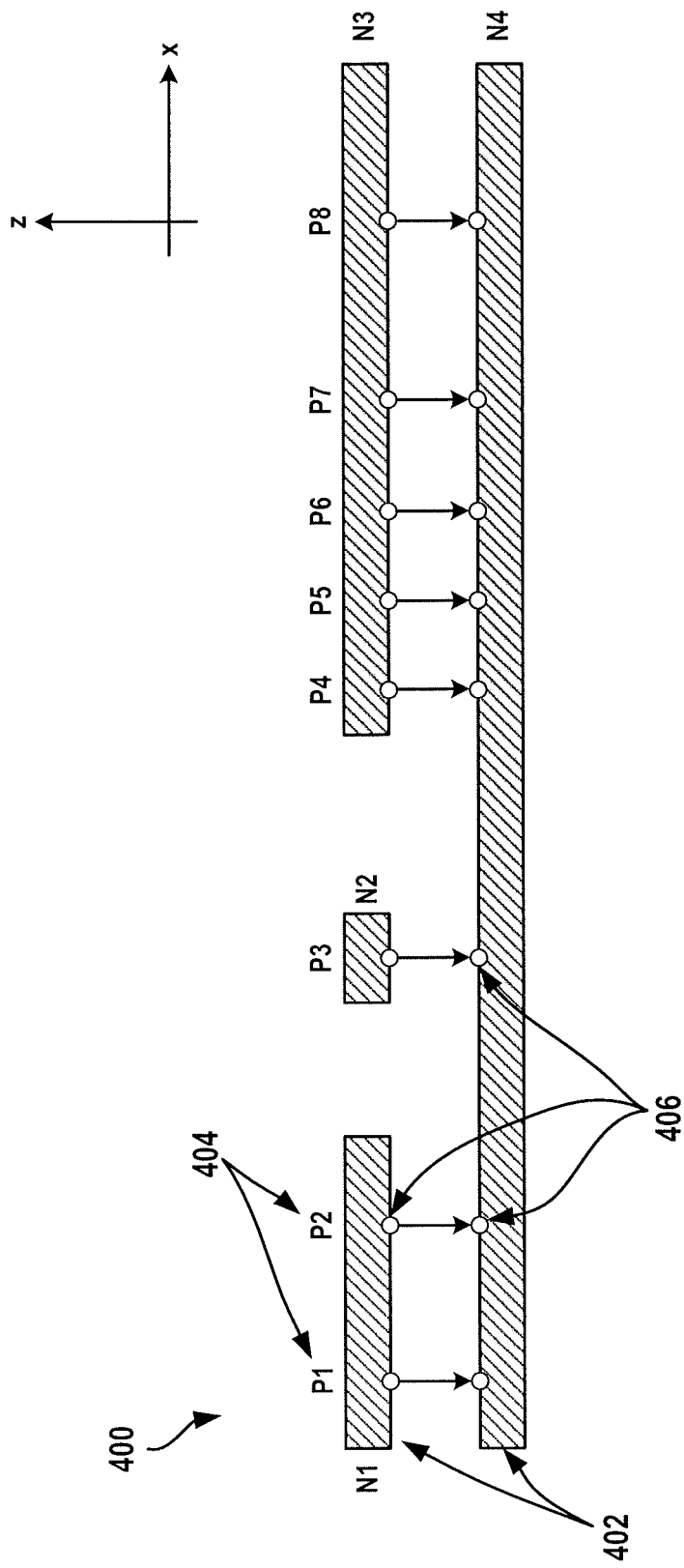
FIG. 4 is a schematic diagram of a multi-layer structure having a plurality of ports, consistent with some disclosed embodiments.

FIG. 4 is a schematic diagram of an exemplary multi-layer structure. Similar to FIG. 2A, FIG. 4 is also a "side" view, with z direction pointing to the "thickness" direction. In FIG. 4, multi-layer structure (or network model in mathematical representation) 400 includes shadowed slabs 402 representing conductive materials, such as metal. As used herein, conductive materials 402 are referred to as "nets." A net is an electrically connected metal piece. For example, in FIG. 4, there are four nets: N1, N2, N3, and N4. A pair of nets may include one or more ports (404). As discussed above, a port 404 is defined by two terminals (406), each of which is on one net of the pair. For example, FIG. 4 shows eight ports: P1-P8, each of which is defined by two terminals. Ports P1 and P2 are defined by terminals on net pair N1 and N4; port P3 is defined by terminals on net pair N2 and N4; and ports P4-P8 are defined by terminals on net pair N3 and N4. It is noted that the nets and ports shown in FIG. 4 are simplified schematics. In actual multi-layer structures, a net may extend to multiple layers and may have a 3D shape, as long as one or more metal pieces of the net are electrically connected together.

In electromagnetic (EM) simulation, EM field at each port may be a complicate time varying three-dimensional function. To simplify the simulation and reduce computational cost, approximations are often used to represent EM field subject to certain error tolerance. For example, EM field may be approximated by a set of modes using mode expansion technique. Mode expansion refers to a process of expanding a field into a set of basic, known field components called modes. In some embodiments, the expansion technique may also be known as vector expansion and the resulting set of basic, known field components are called eigenvectors. The field may then be represented by a summation of the set of modes or eigenvectors. The exact representation of the field may require an infinite number of modes/eigenvectors. Therefore, an approximation may be obtained by considering only the first several modes/eigenvectors of the set. Because the number of modes/eigenvectors chosen to approximate the field relates to the order of linear system constructed in a later stage simulation, a truncation of number of modes/eigenvectors is often referred to as "order reduction." One or more of the modes/eigenvectors under such approximation may be called "dominant modes/eigenvectors," as the combination of these dominant modes/eigenvectors may contain most of the power of the original field.

Similarly, an excitation field used to provide power/energy source in a simulation can also be expanded into elements such as modes or eigenvectors. During simulation, instead of applying a complicated field excitation, the elements after expansion, referred to as "expansion elements," can be applied separately to arrive at an equivalent effect of applying the original field excitation.

In a simulation involving multiple ports, the above-discussed expansion process can be applied for each port. As a result, a combination of expansion elements can be obtained. For example, there are eight ports: P1-P8 in FIG. 4, therefore, after expansion, the expansion elements may be represented as:

$$[v_1, v_2, \ldots]_{P1}, [v_1, v_2, \ldots]_{P2}, \ldots, [v_1, v_2, \ldots]_{P8} \qquad (1)$$

In expression (1), $v_1, v_2, \ldots$ are expansion elements (e.g., modes including transverse modes, eigenvectors, etc.). For each port, there may be different number of expansion elements. For example, there may be $n_1$ expansion elements for port P1, $n_2$ expansion elements for port P2, ..., and $n_8$ expansion element for port P8. As a result, the total number of expansion elements for structure/network 400 is $N=n_1+n_2+\ldots+n_8$. During simulation, N elements would be used to construct a linear system calculating field distribution.

Applicant observes that, each port is defined by two terminals and each terminal is in turn associated with a net. Therefore, it is possible to group the ports based on their associated net pair. For example, in FIG. 4, ports P1 and P2 are associated with net pair N1 and N4; port P3 is associated with net pair N2 and N4; and ports P4-P8 are associated with net pair N3 and N4. Thus, P1 and P2 can be combined into a group $g_1=\{P1, P2\}$; P3 can be a second group $g_2=\{P3\}$; and P4-P8 can be combined into a third group $g_3=\{P4, P5, P6, P7, P8\}$. Applicant also observes that, the ports of a group are associated with the same net pair; and each net pair, when expanded as a single entity, results in the same dominant modes. Therefore, all ports associated with the same net pair (e.g., in the same group) would share the same dominant modes. As a result, if the expansion is based on net pairs/groups instead of ports, it is possible to further reduce the number of expansion elements. For example, in FIG. 4, the expansion elements after the above-discussed expansion can be represented as:

$$[v_1, v_2, \ldots]_{g1}, [v_1, v_2, \ldots]_{g2}, [v_1, v_2, \ldots]_{g3} \quad (2)$$

In expression (2), the number of expansion elements in $g_1$, $g_2$, and $g_3$ are $n_1$, $n_3$, and $n_4$, respectively. Therefore, the total number of elements is $M=n_1+n_3+n_4$, which is significantly smaller than N, thereby further reducing the order and improving efficiency and simulation speed.

Figure 5:
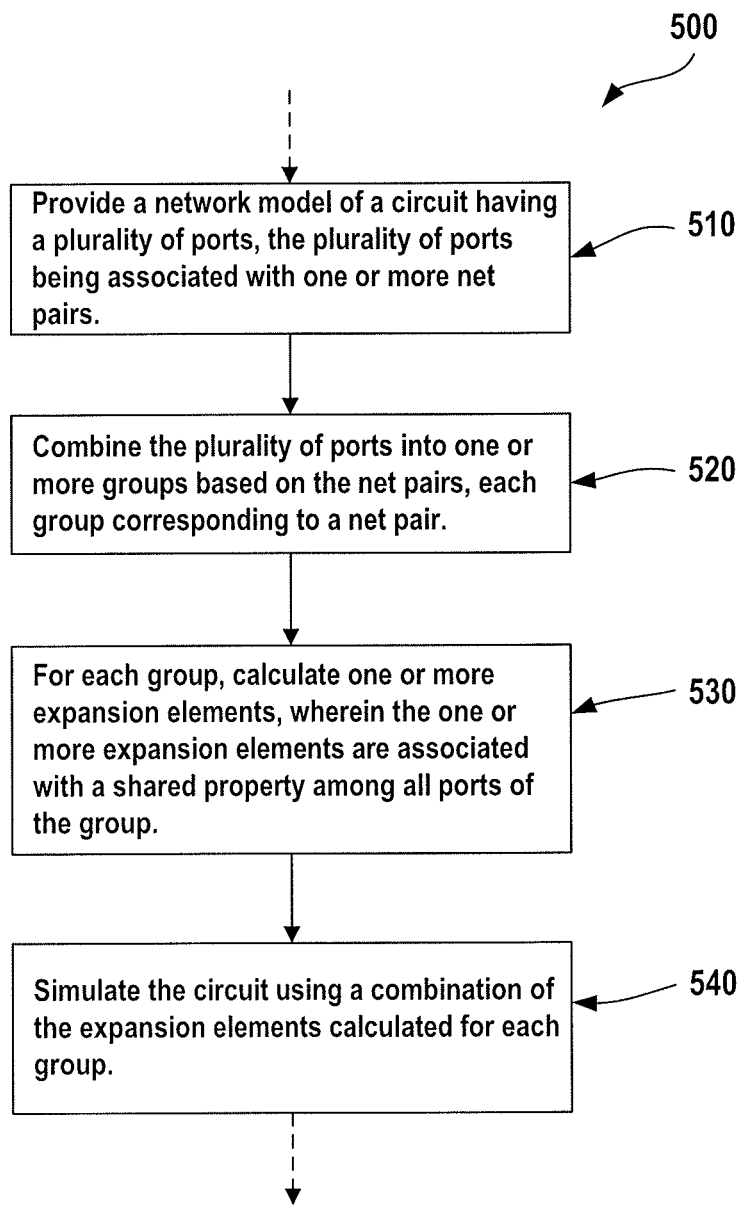
FIG. 5 shows a flow chart of an exemplary method for model order reduction, consistent with some disclosed embodiments.

FIG. 5 shows a flow chart of an exemplary method for model order reduction. In FIG. 5, a method 500 may include a series of steps, in accordance with some embodiments. In step 510, there may be provided a network model of a circuit having a plurality of ports (e.g., network 400 with ports 404). The plurality of ports may be associated with one or more net pairs (e.g., net pairs 402). In step 520, the plurality of ports may be combined into one or more groups (e.g., groups {P1, P2}, {P3}, and {P4, P5, P6, P7, P8}) based on the net pairs (e.g., net pairs {N1, N4}, {N2, N4}, and {N3, N4}). Each group may correspond to a net pair. For example, group {P1, P2} corresponds to net pair {N1, N4}, etc. In step 530, one or more expansion elements may be calculated for each group (e.g., expression 2). The expansion elements may be associated with a shared property among all ports of that group (e.g., dominant mode). In step 540, the circuit may be simulated using a combination of the expansion elements calculated for each group (e.g., a total number of $M=n_1+n_3+n_4$ elements in the example of FIG. 4), thereby reducing the order (e.g., the number of modes/eigenvectors) of the network mode. The dashed arrows above step 510 and below step 540 indicate that the method 500 may be part of another method that includes more steps.

A simulation project may include one or more network models. For each model, similar process may be preformed to reduce the order of the model and improve efficiency.

In the foregoing Description of Exemplary Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Exemplary Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method, implemented by a computer, for simulating a circuit, the method comprising:
   providing a network model of the circuit having a plurality of ports, each of the plurality of ports being associated with a net pair of one or more net pairs and each of the plurality of ports defined by two terminals, wherein each of the plurality of ports corresponds to one of an input and output of the circuit;
   combining the plurality of ports into one or more groups based on the associated net pairs, wherein each group corresponds to one of the net pairs;
   calculating a plurality of mode expansion elements of an electromagnetic field for each of the plurality of ports in each group;
   for each group, determining one or more mode expansion elements of the calculated plurality of mode expansion elements that are shared by each of the plurality of ports in the group, wherein (i) the one or more shared mode expansion elements are one or more dominant modes and (ii) each of the plurality of ports includes at least one mode expansion element that is different from any of the one or more shared mode expansion elements; and
   simulating the circuit using the one or more shared mode expansion elements determined for each of the groups.

2. The method of claim 1, wherein each of the one or more net pairs includes first and second nets, each of the first and second nets being defined based on one or more electrically conductive structures that are electrically connected.

3. The method of claim 1, wherein a number of the one or more net pairs is less than a number of the plurality of ports.

4. The method of claim 1, wherein the plurality of mode expansion elements are transverse modes.

5. The method of claim 4, wherein the one or more dominant modes contain a majority of power of the electromagnetic field of the circuit.

6. The method of claim 1, wherein the calculating step further includes vector expansion and the mode expansion elements are eigenvectors.

7. The method of claim 1, wherein the simulating step uses fewer mode expansion elements compared with simulating the circuit using the plurality of mode expansion elements for each port.

8. The method of claim 1, wherein:
   the combining step includes forming a group of ports responsive to a determination that each port in the group is associated with a same net pair; and
   a port is associated with a net pair if the two terminals of the port are located on the net pair.

9. A non-transitory computer-readable medium encoded with software code instructions, when executed by a computer, implementing a method for simulating a circuit, the method comprising:
   providing a network model of the circuit having a plurality of ports, each of the plurality of ports being associated with a net pair of one or more net pairs and each of the plurality of ports defined by two terminals, wherein each of the plurality of ports corresponds to one of an input and output of the circuit;
   combining the plurality of ports into one or more groups based on the associated net pairs, wherein each group corresponds to one of the net pairs;
   calculating a plurality of mode expansion elements of an electromagnetic field for each of the plurality of ports in each group;

for each group, determining one or more mode expansion elements of the calculated plurality of mode expansion elements that are shared by each of the plurality of ports in the group, wherein (i) the one or more shared mode expansion elements are one or more dominant modes and (ii) each of the plurality of ports includes at least one mode expansion element that is different from any of the one or more shared mode expansion elements; and simulating the circuit using the one or more shared mode expansion elements determined for each of the groups.

10. The non-transitory computer-readable medium of claim 9, wherein each of the one or more net pairs net pair includes first and second nets, each of the first and second nets being defined based on one or more electrically conductive structures that are electrically connected.

11. The non-transitory computer-readable medium of claim 9, wherein a number of the one or more net pairs is less than a number of the plurality of ports.

12. The non-transitory computer-readable medium of claim 9, wherein the plurality of mode expansion elements are transverse modes.

13. The non-transitory computer-readable medium of claim 12, wherein the one or more dominant modes contain a majority of power of the electromagnetic field of the circuit.

14. The non-transitory computer-readable medium of claim 9, wherein the calculating step further includes vector expansion and the mode expansion elements are eigenvectors.

15. A system for simulating a circuit, comprising:
a processor; and
a memory communicatively coupled to the processor, wherein the processor is configured to:
load a network model of the circuit having a plurality of ports, each of the plurality of ports being associated with a net pair of one or more net pairs and defined by two terminals, wherein each of the plurality of ports corresponds to one of an input and output of the circuit;
combine the plurality of ports into one or more groups based on the associated net pairs, wherein each group corresponds to one of the net pairs;
calculate a plurality of mode expansion elements of an electromagnetic field for each of the plurality of ports in each group;
for each group, determine one or more mode expansion elements of the calculated plurality of mode expansion elements that are shared by each of the plurality of ports in the group, wherein (i) the one or more shared mode expansion elements are one or more dominant modes and (ii) each of the plurality of ports includes at least one mode expansion element that is different from any of the one or more shared mode expansion elements; and
simulate the circuit using the one or more shared mode expansion elements determined for each of the groups.

16. The system of claim 15, wherein each of the one or more net pairs includes first and second nets, each of the first and second nets being defined based on one or more electrically conductive structures that are electrically connected.

17. The system of claim 15, wherein a number of the one or more net pairs is less than a number of the plurality of ports.

18. The system of claim 15, wherein the plurality of mode expansion elements are transverse modes.

19. The system of claim 18, wherein the one or more dominant modes contain a majority of power of the electromagnetic field of the circuit.

20. The system of claim 15, wherein the processor is further configured to calculate vector expansion for each group and the mode expansion elements are eigenvectors.

* * * * *

UNITED STATES PATENT AND TRADEMARK OFFICE
CERTIFICATE OF CORRECTION

PATENT NO. : 9,542,515 B2  
APPLICATION NO. : 13/305178  
DATED : January 10, 2017  
INVENTOR(S) : Jian Liu et al.

Page 1 of 1

It is certified that error appears in the above-identified patent and that said Letters Patent is hereby corrected as shown below:

In the Claims

Column 9, Line 13, change "more net pairs net pair" to --more net pairs--.

Signed and Sealed this
Eleventh Day of April, 2017

Michelle K. Lee
*Director of the United States Patent and Trademark Office*